United States Patent
Zechmann et al.

(10) Patent No.: US 9,660,037 B1
(45) Date of Patent: May 23, 2017

(54) SEMICONDUCTOR WAFER AND METHOD

(71) Applicant: Infineon Technologies Austria AG, Villach (AT)

(72) Inventors: Arno Zechmann, Villach (AT); Annette Sanger, Villach (AT); Ulrike Fastner, Villach (AT); Beate Weissnicht, Villach (AT); Stefan Krivec, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/969,786

(22) Filed: Dec. 15, 2015

(51) Int. Cl.
| | | |
|---|---|---|
| *H01L 21/338* | (2006.01) | |
| *H01L 31/0256* | (2006.01) | |
| *H01L 29/20* | (2006.01) | |
| *H01L 31/0304* | (2006.01) | |
| *H01L 21/768* | (2006.01) | |
| *H01L 21/027* | (2006.01) | |
| *H01L 29/66* | (2006.01) | |
| *H01L 21/288* | (2006.01) | |

(52) U.S. Cl.
CPC ...... *H01L 29/2003* (2013.01); *H01L 21/0273* (2013.01); *H01L 21/2885* (2013.01); *H01L 21/76865* (2013.01); *H01L 21/76873* (2013.01); *H01L 21/76879* (2013.01); *H01L 29/66462* (2013.01)

(58) Field of Classification Search
CPC .......... H01L 21/0273; H01L 21/76879; H01L 29/2003
USPC .................................... 438/172; 257/76, 615
See application file for complete search history.

(56) References Cited

U.S. PATENT DOCUMENTS

| | | |
|---|---|---|
| 8,796,764 B2 | 8/2014 | Blank et al. |
| 9,148,092 B1 | 9/2015 | Brown et al. |
| 2016/0086847 A1* | 3/2016 | Zechmann ............ H01L 23/485 257/737 |
| 2016/0088737 A1* | 3/2016 | Iijima ..................... H01L 24/19 361/748 |

* cited by examiner

*Primary Examiner* — David S Blum
(74) *Attorney, Agent, or Firm* — Murphy, Bilak & Homiller, PLLC

(57) ABSTRACT

In an embodiment, a method includes forming an adhesion promotion layer on at least portions of a conductive surface arranged on a Group III nitride-based semiconductor layer, applying a resist layer to the adhesion promotion layer such that regions of the conductive surface are uncovered by the adhesion promotion layer and the resist layer, applying by electroplating a conductive layer to the regions of the conductive surface uncovered by the adhesion promotion layer and the resist layer, and removing the resist layer and removing the adhesion promotion layer.

19 Claims, 5 Drawing Sheets

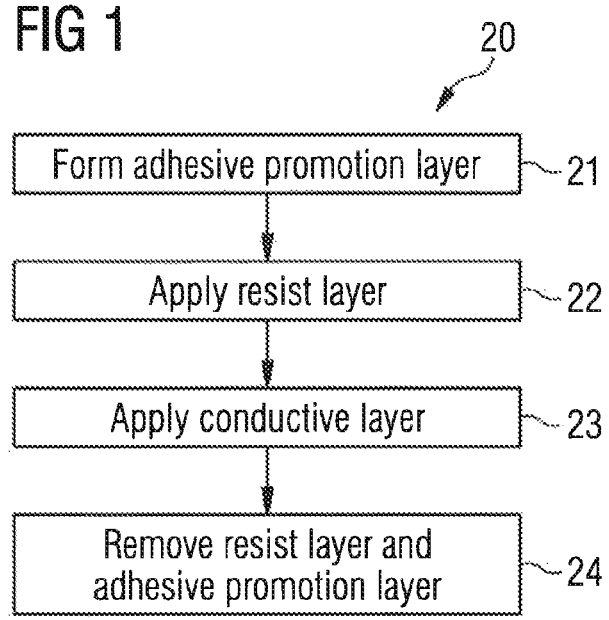
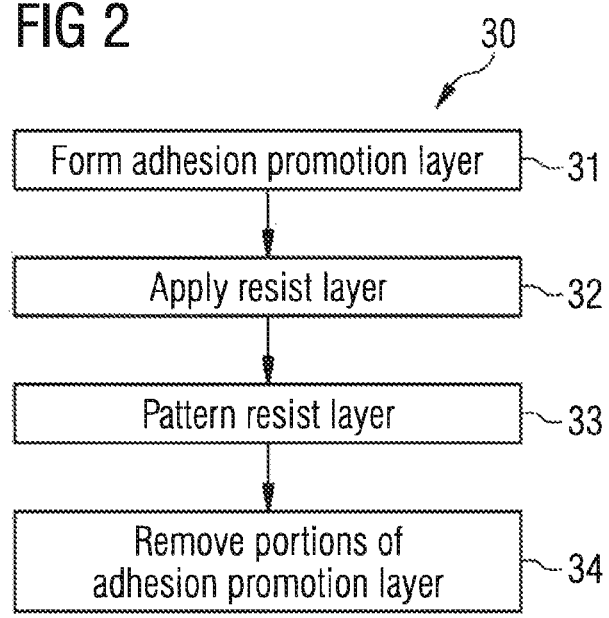

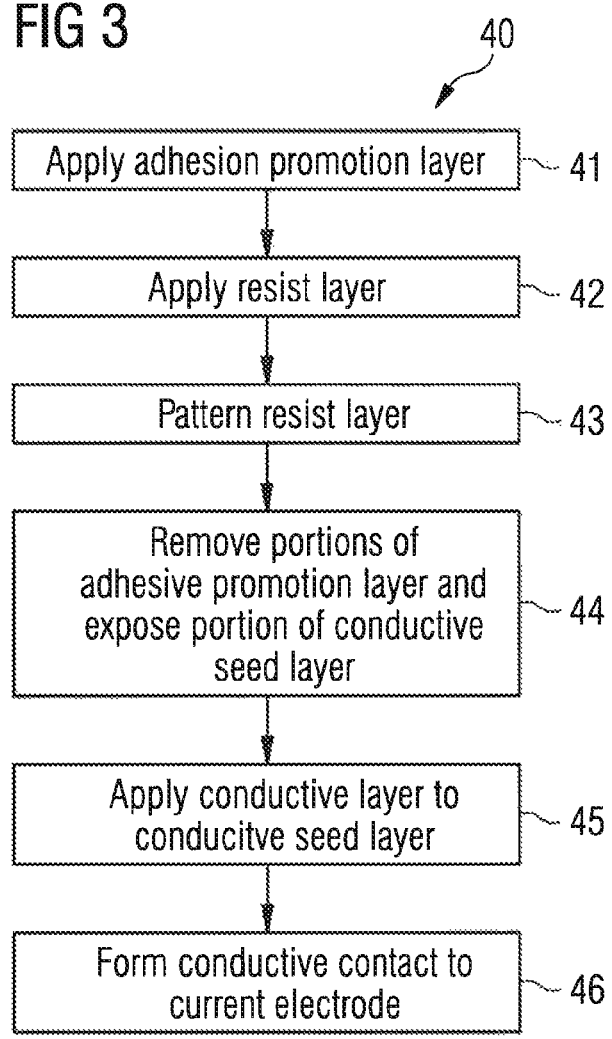

SEMICONDUCTOR WAFER AND METHOD

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a semiconductor wafer includes a Group III nitride-based layer, a noble metal layer arranged on the Group III nitride-based layer and a sacrificial adhesion promotion layer arranged on at least portions of the noble metal layer.

In an embodiment, a method includes forming an adhesion promotion layer on at least portions of a conductive surface arranged on a Group III nitride-based semiconductor layer, applying a resist layer to the adhesion promotion layer such that regions of the conductive surface are uncovered by the adhesion promotion layer and the resist layer, applying a conductive layer by electroplating to the regions of the conductive surface uncovered by the adhesion promotion layer and the resist layer, removing the resist layer and removing the adhesion promotion layer.

In an embodiment, a method includes applying an adhesion promotion layer to a conductive seed layer arranged on a Group III nitride-based transistor device, applying a resist layer to the adhesion promotion layer, patterning the resist layer and exposing a first region of the adhesion promotion layer, removing at least portions of the first region of the adhesion promotion layer and exposing a first region of the conductive seed layer, the first region of the conductive seed layer being coupled to a current electrode of the Group III nitride-based transistor device, applying a conductive layer to the first region of the seed layer by electroplating, and forming a conductive contact to the current electrode.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1 illustrates a flow diagram of a method according to a first embodiment.

FIG. 2 illustrates a flow diagram of a method according to a second embodiment.

FIG. 3 illustrates a flow diagram of a method according to a third embodiment.

DETAILED DESCRIPTION

Figure 4:
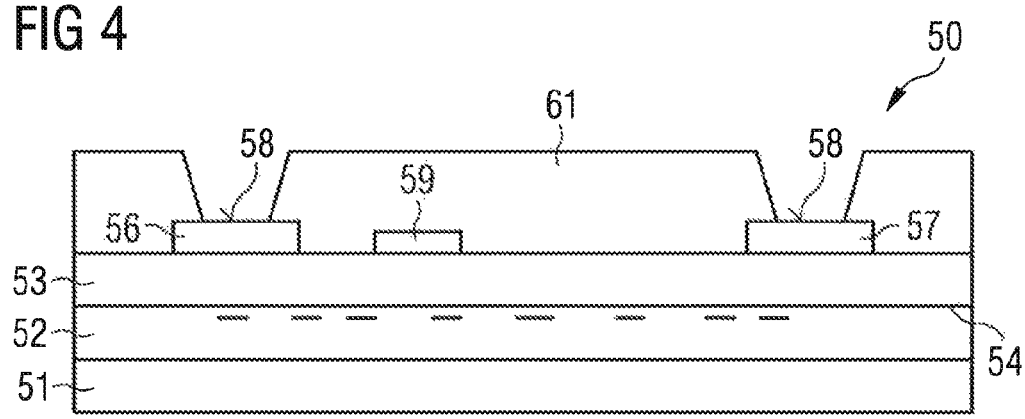
FIG. 4 illustrates a schematic view of a Group III nitride-based layer.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off. An enhancement-mode device is not limited to low voltages and may also be a high-voltage device.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where $0<x<1$.

FIG. 1 illustrates a flow diagram 20 of a method according to a first embodiment. The method may be used to improve the adhesion of a resist layer to a conductive surface arranged on a Group III nitride-based semiconductor layer and, in particular, a photoresist layer to a conductive surface of a noble metal, such as gold, arranged on a Group III nitride-based semiconductor layer. The resist layer may be used in methods for forming a metallization structure on a Group III nitride-based semiconductor device.

In block 21, an adhesion promotion layer is formed on at least portions of a conductive surface arranged on a Group III nitride-based semiconductor layer. In block 22, a resist layer is applied to the adhesion promotion layer such that regions of the conductive surface are uncovered by the adhesion promotion layer and the resist layer. In block 23, a conductive layer is applied to the regions of the conductive surface which are uncovered by the adhesion promotion layer and the resist layer. The conductive layer may be applied using techniques such as electroplating. In block 24, the resist layer and the adhesion promotion layer are removed.

The adhesion promotion layer is arranged between the conductive surface arranged on the Group III nitride-based semiconductor layer and the resist layer. The adhesion promotion layer may be used to assist in the temporary adhesion of the resist layer to the conductive surface during the deposition of the conductive layer such that the resist layer acts as a more accurate and exact mask. The adhesion promotion layer may be fully removed after deposition of the conductive layer and be absent from the final product. In these embodiments, the adhesion promotion layer may be considered to be a sacrificial adhesion promotion layer.

Adhesion of the resist layer to the conductive layer may be limited by the type of bond formed between the material of the resist layer and the conductive surface. For example, for noble metals such as a gold layer, the resist layer may form only van der Waals forces to the conductive layer. Since van der Walls forces are relatively weak and easily broken, the resist layer may detach during subsequent processing stages. During deposition methods such as electroplating, the resist layer is immersed in a solution. The solution may include a component or have a pH value which also encourages the resist layer to detach from the conductive surface. The material of the adhesion promotion layer may be selected such that a stronger type of bond is formed to the conductive surface and to the resist layer.

The method may be used to increase the adhesion of a resist layer to a noble metal such as gold. The adhesion promotion layer may include any material which has a greater adhesive strength to the material of the resist layer and greater than the adhesive strength of the resist layer to the conductive surface. In embodiments in which the conductive surface is provided by a gold layer, the adhesion promotion layer may include titanium metal. The resist layer may be a photodefinable resist layer, such as photodefinable polyimide.

Gold may be used as part or all of a metallization structure applied to a Group III nitride-based semiconductor device, such as a Group III nitride-based transistor device. For example, the conductive surface may be provided by a gold seed layer and the conductive layer may include gold and provide the power metallization structure of the Group III nitride based transistor device for the source and drain. The gate metallization may be fabricated using the same or a different process. The composition of the gate metallization may differ from the composition of the power metallization.

The Group III nitride-based transistor device may be an enhancement mode device or a depletion mode device, a high-voltage device or a low-voltage device. In an embodiment, the Group III nitride-based transistor device is a High Electron Mobility Transistor (HEMT).

The adhesion promotion layer may be formed on at least portions of the conductive surface using various methods. An embodiment of a method is illustrated with the assistance of a flow diagram 30 in FIG. 2.

In block 31, the adhesion promotion layer is formed on substantially the entire area of the conductive surface by applying the adhesion promotion layer to the conductive surface. In block 32, the resist layer is applied to substantially the entire area of the adhesion promotion layer. In block 33, the resist layer is patterned or structured and portions removed to expose a first region of the adhesion promotion layer. In block 34, at least portions of the first region of the adhesive adhesion promotion layer are removed so as to expose a first region of the underlying conductive surface. In this embodiment, the resist layer is used as a mask for patterning and removing portions of a continuous adhesion promotion layer and as a mask for electroplating the conductive layer to the first region of the conductive surface.

FIG. 3 illustrates a flow diagram 40 of a method according to a third embodiment. The method may be used to form a conductive contact to a current electrode, such as source or drain, of a Group III nitride-based transistor device. In some embodiments, the method is used to form the power metallization structure of a Group III nitride-based transistor device including a conductive contact to a source electrode and a conductive contact to a drain electrode of the Group III nitride-based transistor device.

In block 41, an adhesion promotion layer is applied to a conductive seed layer arranged on a Group III nitride-based transistor device. The conductive seed layer may include gold and may extend substantially entirely over a major surface of the Group III nitride-based transistor device such that it can form an electrode of a galvanic cell for a subsequent electroplating process. The adhesion promotion layer may also extend substantially entirely over the major surface of the conductive seed layer.

In block 42, a resist layer is applied to the adhesion promotion layer. The resist layer may include a photodefinable or photoimagable polymer composition. The resist layer may also extend substantially entirely over the major surface of the adhesion promotion layer.

In block 43, the resist layer is patterned so as to expose a first region of the adhesion promotion layer. For example, the resist layer may be selectively exposed to electromagnetic radiation, such as UV light, to cure portions of the resist layer. The cured or uncured portion of the resist layer may be removed to expose a first region of the adhesion promotion layer.

In block 44, at least portions of the first region of the adhesion promotion layer which are exposed from the resist layer are removed so as to expose a first region of the conductive seed layer underlying the adhesion promotion layer. The first region of the conductive seed layer is coupled to a current electrode of the Group III nitride-based transistor device.

In block 45, a conductive layer is applied to the first region of the conductive seed layer by electroplating such that in block 46 a conductive contact is formed to the current electrode. The conductive layer is applied by electroplating and is electrically coupled to the current electrode by way of the conductive seed layer.

In some embodiments, the method further includes, after the deposition of the conductive layer, removing the resist layer and exposing the remainder of the adhesion promotion layer which was arranged underneath the resist layer, between the resist layer and the conductive seed layer. The remainder of the adhesion promotion layer is removed, thus exposing a second region of the conductive seed layer which is arranged adjacent the current electrode. The second region of the conductive seed layer is then removed so that the metallization structure coupled to the current electrode is no longer electrically coupled to any further portion or portions of the metallization structure by the conductive seed layer.

This embodiment may be used to produce a power metallization structure for a Group III nitride-based transistor device which includes a first metallization structure for the source electrode and a second metallization structure for the drain electrode. After deposition of the conductive layer, the conductive seed layer extends between and electrically couples two portions of the conductive layer which are electrically coupled to differing current electrodes. The adhesion promotion layer and the conductive seed layer are removed in regions adjacent the conductive layer and current electrodes, i.e. in regions underlying the resist layer, to electrically decouple the current electrodes, i.e. the source and the drain electrode.

The conductive seed layer and the conductive layer may include gold and the adhesion promotion layer may include titanium. The adhesion promotion layer may be entirely removed and is absent in the Group III nitride-based transistor device. The adhesion promotion layer may be considered as a sacrificial layer.

In an embodiment, the method further includes applying the conductive seed layer to the Group III nitride-based layer. The conductive seed layer provides the conductive surface onto which the adhesion promotion layer and the conductive layer are applied.

In an embodiment, the method further includes applying a conductive diffusion barrier layer to the Group III nitride-based layer and applying the conductive seed layer to the conductive diffusion barrier layer. The conductive diffusion barrier layer may be provided to prevent diffusion of the material of the conductive seed layer into the Group III nitride-based layer and vice versa. The conductive diffusion barrier may include at least one of the group consisting of titanium and tungsten.

After the conductive layer has been electroplated and the resist layer and the adhesion promotion layer removed, at least portions of the second region of the seed layer are removed to expose a first region of the diffusion barrier layer. At least portions of this first region of the diffusion barrier layer may then be removed.

The adhesion promotion layer may be applied by various techniques including physical vapour deposition, such as sputtering, chemical vapour deposition, electroplating or electroless plating.

The conductive seed layer may be applied by physical vapour deposition, chemical vapour deposition, electron beam (e-beam) evaporation, electroplating or electroless plating.

The conductive diffusion barrier layer may be applied by physical vapour deposition, chemical vapour deposition or electroless plating.

Electroless plating is also known as chemical or autocatalytic plating and describes a non-galvanic plating method that includes simultaneous reactions in an aqueous solution which occur without the use of external electrical power so that a layer is deposited on a substrate which is in contact with the solution. Electroplating differs from electroless plating in that an external electrical power source is used.

The conductive layer may be applied to the conductive surface by electroplating. In electroplating, an external power supply is applied to a substrate immersed in a solution including a metal ion or metal complex of the metal which is to be deposited onto the substrate. For an electroplated gold layer, the metal complex may include gold and one of the group consisting of cyanide, sulphate and thiosulfate. The conductive seed layer may act as an electrode of the galvanic cell.

The adhesion promotion layer may be removed by wet etching or gas phase etching or plasma etching in two stages, before and after the electrodeposition of the conductive layer. The first region and the second region of the adhesion promotion layer may be removed by selective wet etching. In selective etching, the etching rate of the material of the adhesion promotion layer is greater than the etching rate of the underlying material of the conductive surface, for example at least 10 times greater.

The seed layer and the diffusion barrier layer may be removed by wet etching or gas phase etching or selective wet etching.

The adhesion promotion layer may be electrically conductive or electrically insulating. An electrically insulating layer may be used in embodiments in which the adhesion promotion layer is removed from the conductive surface entirely at regions between the conductive layer and the conductive surface.

The Group III nitride-based layer may form part of a semiconductor device. The semiconductor device may be a Light Emitting Diode (LED), a diode such as a Schottky diode, a transistor such as a High Electron Mobility Transistor or a bi-directional switch.

In an embodiment, a semiconductor wafer includes a Group III nitride-based layer, a noble metal layer arranged on the Group III nitride-based layer and a sacrificial adhesion promotion layer arranged on at least portions of the noble metal layer. The noble metal layer and the sacrificial adhesion layer may be deposited using physical vapour deposition or chemical vapour deposition techniques for example. The wafer may further include a substrate, such as silicon, sapphire or SiC and further buffer or transition layers and/or further Group III nitride layers between the substrate and the Group III nitride-based layer. The Group III nitride-based layer may be monocrystalline and expitaxially grown on the substrate.

In some embodiments, the semiconductor wafer further includes a resist layer arranged on at least portions of the sacrificial adhesion promotion layer. In some embodiments, the wafer includes a structured resist layer which is attached to the Group III nitride-based layer by way of a structured adhesion promotion layer. The exposed or free-lying portions of the noble metal layer have a lateral form substantially corresponding to that lateral form of a desired metallization structure.

The wafer according to one of the embodiments described herein may serve as a precursor or intermediate product in methods in which the adhesion promotion layer provides improved adhesion to a resist layer which acts as a mask for the electrodeposition of a conductive layer onto the Group III nitride-based layer.

An exemplary method for forming a power metallization structure on a Group III nitride-based High Electron Mobility Transistor (HEMT) device will now be described with reference to FIGS. 4 to 9.

FIGS. 4 to 9 illustrate a single component position of a wafer including a plurality of component positions. The various processes of the method may be carried out on all of the component positions of the wafer substantially simultaneously.

The wafer 50 includes a substrate 51 and two or more Group III nitride-based layers 52, 53 which include a heterojunction 54 supporting a two-dimensional electron gas (2DEG) indicated schematically with dashed line 55. The Group III nitride-based layers 52, 53 are epitaxially deposited on the substrate 51 and are monocrystalline. For example, a gallium nitride (GaN) channel layer 52 may be arranged on the substrate 51 and an aluminium gallium nitride-based barrier layer 53 arranged on the gallium nitride channel layer. A heterojunction 54 and the two-dimensional electron gas 55 are formed at the interface between the gallium nitride-based channel layer 52 and the aluminium gallium nitride-based layer 53.

The substrate 51 may include a single crystal wafer such as a silicon wafer, a sapphire wafer or a silicon carbide wafer. One or more buffer or transition layers including a Group III nitride may be arranged between the channel layer 52 and the substrate 51. In some embodiments, the upper surface of the Group III nitride-based layer 53 may include one or more passivation or dielectric layers 61. The passivation layer and/or dielectric layer 61 may be electrically insulating and may include silicon nitride or a silicon oxide, for example.

Each component position provides a single High Electron Mobility Transistor device and includes a source electrode 56 and a drain electrode 57, each having a conductive surface 58. Each component position includes a gate electrode 59 arranged laterally between the source electrode 56 and the drain electrode 57.

Figure 5:
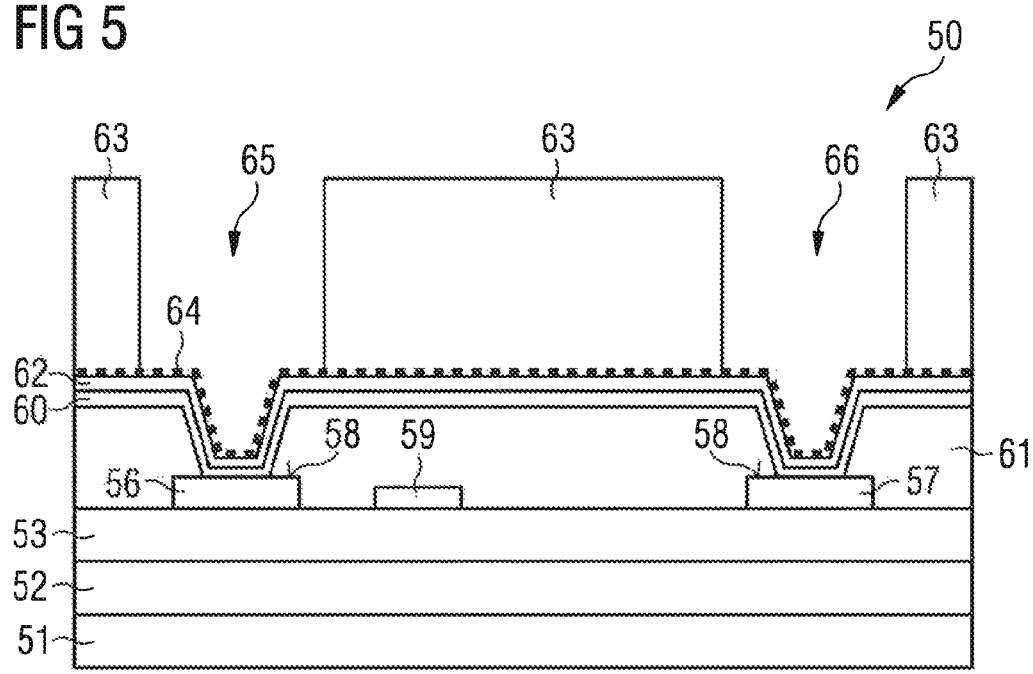
FIG. 5 illustrates a schematic view of a resist layer arranged on a sacrificial adhesion promotion layer arranged on the Group III nitride based layer.

As is illustrated in FIG. 5, a diffusion barrier layer 60 may be deposited onto the conductive surface 58 of the source electrode 56 and the drain electrode 57. The diffusion barrier layer 60 may further extend over the passivation layer and/or dielectric layer 61. The diffusion barrier layer 60 may include titanium and/or tungsten, for example. The diffusion barrier layer 60 may also include two or more sublayers. The diffusion barrier layer 60 may be used to prevent interdiffusion between the materials of the overlying metallization structure and the underlying conductive surface 58 and Group III nitride-based layers 52, 53.

A conductive seed layer 62 is applied to the diffusion barrier layer 60. The conductive seed layer 62 covers the entire surface of the wafer 50 and provides a single continuous conductive path such that the conductive seed layer 62 may act as an electrode in a galvanic cell for the subsequent electrodeposition of a metal layer on to the conductive seed layer 62. In some embodiments, the conductive seed layer 62 includes a noble metal. One particular embodiment, the conductive seed layer 62 includes gold.

In order that the subsequently deposited conductive layer providing the power metallization structure has the desired lateral form, a resist layer 63 is applied to the conductive seed layer 62. For some noble metals, such as gold, and for some electrolytes, the adhesion between the material providing the resist layer 63 and the material of the conductive seed layer 62 may be insufficient to provide desirably accurate masking of the underlying of the portions of the conductive seed layer 62. Consequently, an adhesion promotion layer 64 may be applied to the conductive seed layer 62. The adhesion promotion layer is indicated with the dotted line in FIGS. 4 to 9.

The adhesion promotion layer 64 may cover the entire surface of the conductive seed layer 62 and the entire upper surface of the wafer 50 and be used to increase the adhesion between the resist layer 63 and the conductive seed layer 62. In some embodiments, the adhesion promotion layer 64 has an adhesive strength to the material of the conductive seed layer 62 which is higher than the adhesive strength between the material of the resist layer 63 and the material of the conductive seed layer 62. In some embodiments, the conductive seed layer includes gold and the adhesion promotion layer 64 includes titanium.

The resist layer 63 may be applied to the adhesion promotion 64 and selectively moved to provide an opening 65, 66 above the source electrode 56 and drain electrode 57, respectively, such that a portion of the adhesion promotion layer 64 forms the base of the openings 65, 66.

The lateral form of the openings 65, 66 may correspond to the desired lateral form of the finished power metallization on the upper surface of the High Electron Mobility Transistor device.

The diffusion barrier layer 60, the conductive seed layer 62 and the adhesion promotion layer 64 may be applied by the same method or different methods. In some embodiments, the diffusion barrier layer 60, the conductive seed layer 62 and the adhesion promotion 64 are deposited by a physical vapour deposition technique such as sputtering.

The resist layer 63 may be applied by spin coating and, in the case of a photoimagable material, may be structured by exposing portions of the resist layer 63 to electromagnetic radiation such as UV light.

Figure 6:
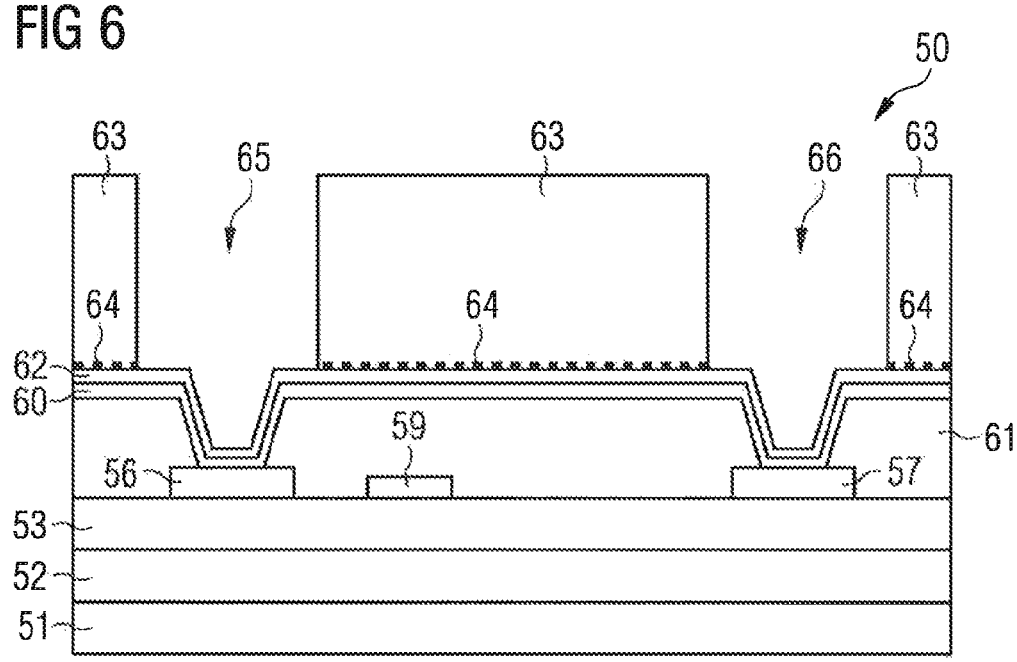
FIG. 6 illustrates a schematic view of the Group III nitride-based layer after the removal of portions of the sacrificial adhesion promotion layer.

As is illustrated in FIG. 6, the adhesion promotion layer 64 is removed from the base of the openings 65, 66 such that the base of the openings 65, 66 is formed by a portion of the conductive seed layer 62. The adhesion promotion layer 64 may be removed by methods such as gas phase etching or wet etching and may be removed by selective wet etching over the material of the underlying conductive seed layer 62. At this stage, the adhesion promotion layer 64 is arranged only at the interface between the resist layer 63 and the underlying portions of the conductive seed layer 62.

The adhesion promotion layer 64 may be removed from the base of the openings 65, 66 if the material of the adhesion promotion layer should not form part of the power metallization of the transistor device.

Figure 7:
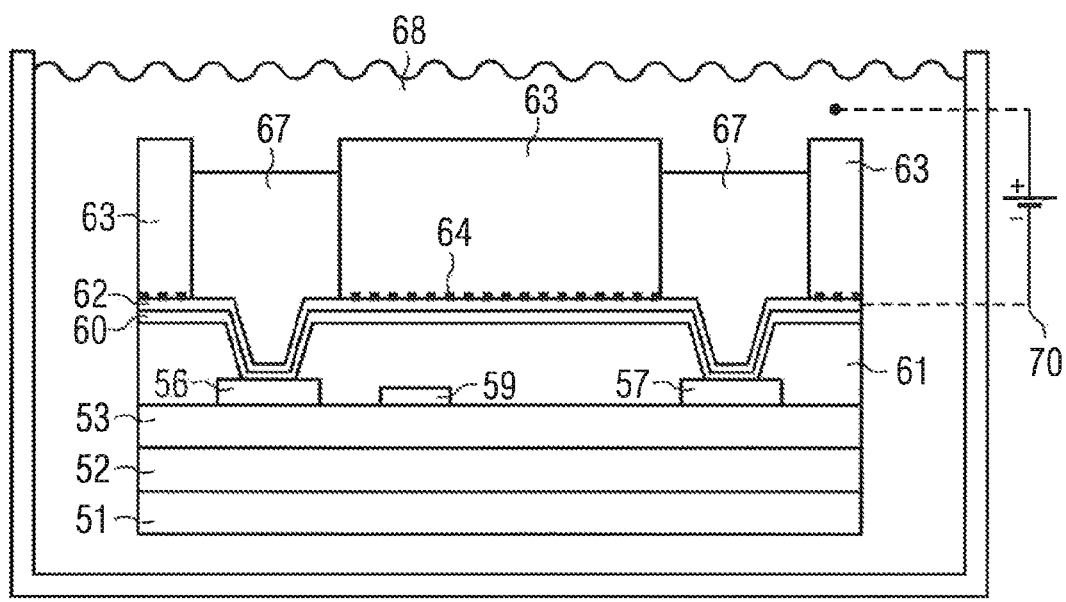
FIG. 7 illustrates a schematic view of a conductive layer on the Group III nitride-based layer.

FIG. 7 illustrates a conductive layer 67 applied by electroplating into the openings 65, 66 formed in the resist layer 63. The wafer 50 is immersed in an electrolytic bath 68 which includes the metal which should form the conductive layer 67. In one particular embodiment, the conductive layer 67 includes gold which is deposited directly upon the gold seed layer 62. As mentioned above, the conductive seed layer 62 extends continuously across the surface of the wafer 50 and may be used as a first electrode 67 of the galvanic cell which includes an external power supply 70. The metal to be deposited, in this case gold, is typically provided in the form of metal ions or one or more metal complexes within the electrolytic bath 68. A cyanide-based electrolyte for electroplating gold may be used due to the improved adhesion of the resist layer 63 to the gold conductive seed layer 62 due to the presence of the titanium adhesion promotion layer 64.

Figure 8:
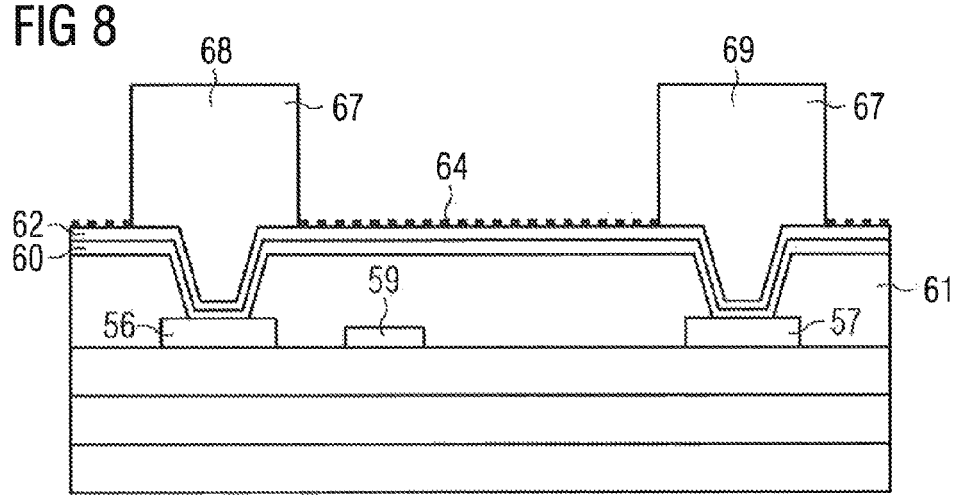
FIG. 8 illustrates a schematic view of the Group III nitride-based layer and the conductive layer after removal of the resist layer.

FIG. 8 illustrates the wafer after the electrodeposition of the conductive layer 67 and the subsequent removal of the resist layer 63. The adhesion promotion layer 64 is arranged on the remaining portions of the wafer 50 and extends between the first conductive portion 68 of the conductive layer 67 coupled to the source electrode 56 and the second conductive portion 67 which is coupled to the drain electrode 57. Additionally, the conductive seed layer 62 and the diffusion barrier layer 60 also form a continuous layer on the surface of the wafer 50. Since the diffusion barrier layer 60, the conductive seed layer 62 and the adhesion promotion layer 64 are electrically conductive, at this stage, the source electrode 56 is electrically coupled to the drain electrode 57. At this stage, the power metallization structure includes two portions 68, 69 which are arranged on, and electrically coupled to, both the source electrode 56 and the drain electrode 57.

Figure 9:
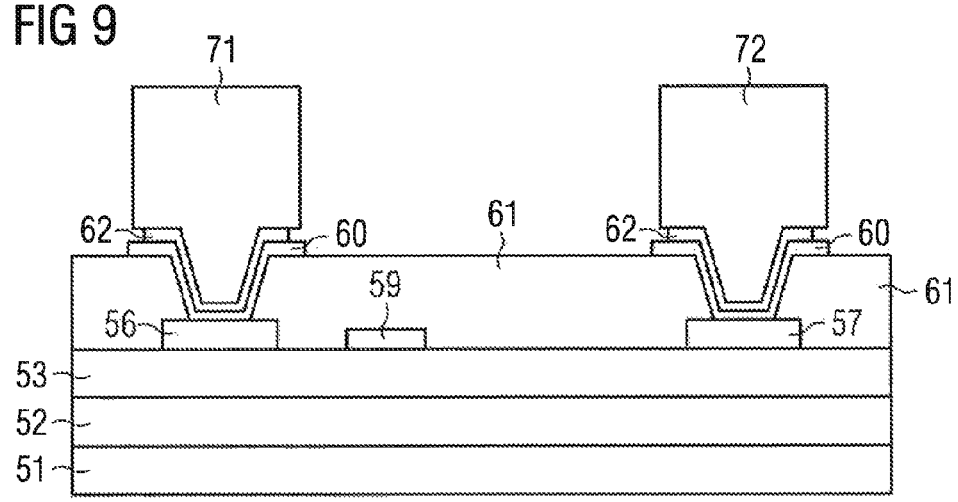
FIG. 9 illustrates a schematic view of the Group III nitride-based layer and the conductive layer after removal of the remainder of the sacrificial adhesion promotion layer.

FIG. 9 illustrates the wafer after the removal of the portions of the adhesion promotion layer 64 which are arranged laterally adjacent the conductive portions 68, 69 of the conductive layer 67 and after the removal of the regions of the conductive seed layer 62 and diffusion barrier layers 60 which are arranged adjacent the first conductive portion 68 and second conductive portion 69. Two separate conductive portions 68, 69 are formed which provide a first metallization structure 71 coupled to the source electrode 56 only and a second metallization structure 72 coupled to the drain electrode 57 only, respectively. The remaining portion of the upper surface is provided by the passivation and/or layer 63.

The adhesion promotion layer 64 may be removed by gas phase etching or wet etching. A selective etch may be used to selectively remove the adhesion promotion layer 64 from the underlying conductive seed layer 62. Depending on the etching process, there may be some underetching of the conductive seed layer 62 and diffusion barrier layer 60 so that the lateral extent of the conductive seed layer 62 and of the barrier layer 60 is smaller than that of the lateral extent for the first metallization structure 71 and the second metallization structure 72.

In the particular embodiment illustrated in FIGS. 4 to 9, the source electrode 56 and the drain electric 57 are illustrated as forming the base of a recessed structure. However, the method for fabricating the power metallization is not limited to use on recessed structures and may also be used in embodiments in which the source electrode and drain electrode are formed on a substantially planar surface.

The source electrode and drain electrode may also extend into the Group III nitride layer. In some embodiments the base of the opening for the source electrode and for the drain electrode may be arranged at the heterojunction, i.e. at the interface between the channel layer and barrier layer.

To summarize, methods are provided in which a sacrificial adhesion layer is used for better resist adhesion on a noble metal. The layer is removed partially before metallization and finally after resist strip. Large areas, such as bond pad enhancement, can be plated using an acidic sulfite based Gold electrolytes. However, the sulfite based electrolyte system may be unstable such that it has to be frequently changed which may in turn result in higher production costs.

Cyanide based electrolytes may be more stable. However, the adhesion of the resist on the seed layer surface during use of a cyanide based electrolyte may not be sufficient for the finer metallization structures for Group III nitride-based semiconductor devices such as HEMTs. Consequently, by using the adhesion promotion layer to improve the adhesion of the resist to the underlying device, a more stable cyanide based plating electrolyte can be used for electro chemical deposition and fine metallization structures achieved for Group III nitride-based semiconductor devices.

To improve the adhesion of the resist during electroplating using a cyanide based electrolyte, a titanium layer is applied as a sacrificial adhesion layer on the Gold seed layer. Without being bound by theory, it is thought that due to the higher reactivity of Titanium, it shows a strong tendency to form covalent bonds to adjacent materials including the gold seed layer and resist. The thickness of the Titanium layer may be between some single atom layers up to tens of nm. The upper value of the thickness may be limited by the etching process to remove the adhesion layer. After the lithographic sequence, the Titanium layer is removed by etching methods using the plating resist as a mask. An etch for Titanium may be used which fails to attack gold and will stop on the Gold surface. This results in a bare Gold surface exposed to the electroplating process.

After plating the metallization, the resist may be removed by standard resist strip methods and a portion of a Ti layer which was buried below the resist is exposed. This Ti layer can now be selectively etched away completely to the underlying Au, followed by a standard Au seed layer etch to remove the remainder of the gold seed layer.

The methods described herein may be used for GaN-based power devices, as well as for GaN-based RF power devices. The methods can be applied also for other semiconductor technologies with thick Gold power metallization.

Interdiffusion of Ti into Au typically occurs at temperatures above around 300-400° C. If no temperature step is carried out at temperatures above 120° C., residuals of the sacrificial layer are not present after processing so that the use of the adhesion promotion layer fails to have an influence on the performance of the final product or system.

Figure 10:
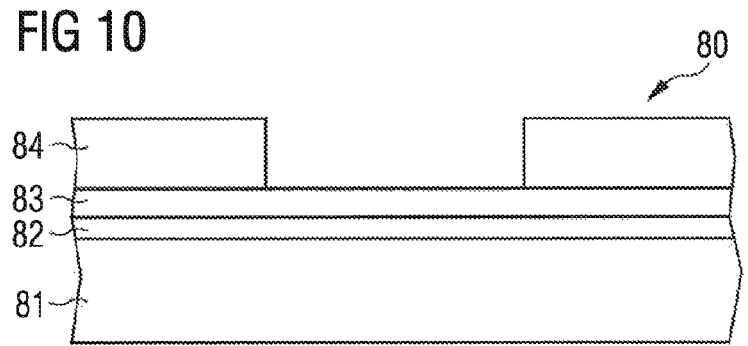
FIG. 10 illustrates a schematic view of a component position of a semiconductor wafer prepared for the electrodeposition of a power metallization structure.

FIG. 10 illustrates a schematic view of a component position of a wafer 80 prepared for the electrodeposition of a power metallization structure.

The semiconductor wafer 80 includes a Group III nitride-based layer 81, a noble metal layer 82 arranged on the Group III nitride-based layer 81 and a sacrificial adhesion promotion layer 83 arranged on at least portions of the noble metal layer 82. The semiconductor wafer 80 may further include a resist layer 84 arranged on at least portions of the sacrificial adhesion promotion layer 83. This wafer may be used as a substrate for the electroplating of a conductive layer onto the adhesion promotion layer 82 or onto the noble metal layer 81, after removal of the portions of the adhesion promotion layer 83 remaining uncovered by the resist layer 84.

The noble metal layer 82 and the sacrificial adhesion promotion layer 83 may be deposited in a vacuum, for example by a physical vapour deposition such as sputtering or a chemical vapour deposition technique. The resist layer 84 may include a photodefinable material such as photosensitive polyimide. The resist layer 84 may be deposited by spin-coating or printing. The resist layer 84 may be structured using photoimaging techniques such that portions of the adhesion promotion layer are exposed from the resist layer 84.

The Group III nitride-based layer may be arranged on a substrate such as a silicon wafer, a sapphire wafer or a silicon carbide wafer. More than on Group III nitride-based layer may be included. For example, a gallium nitride channel layer and an aluminium gallium nitride-based barrier layer arranged on the gallium nitride channel layer, whereby a heterojunction and a two-dimensional electron gas is formed at the interface between the gallium nitride-based channel layer and the aluminium gallium nitride-based layer. The Group III nitride-based layers may be epitaxially deposited and monocrystalline.

The noble metal layer may include gold and provide a portion of the power metallization structure of the Group III nitride based transistor device, such as a High Electron Mobility Transistor (HEMT). The noble metal layer may provide a seed layer which is used as an electrode during electroplating of the power metallization structure. The adhesion promotion layer may include titanium.

The Group III nitride-based layer may form part of a transistor device. The Group III nitride-based transistor device may be a high-voltage device or a low-voltage device, an enhancement mode device or a depletion mode device.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming an adhesion promotion layer on at least portions of a conductive surface arranged on a Group III nitride-based semiconductor layer;
   applying a resist layer to the adhesion promotion layer such that regions of the conductive surface are uncovered by the adhesion promotion layer and the resist layer;
   applying by electroplating a conductive layer to the regions of the conductive surface uncovered by the adhesion promotion layer and the resist layer;
   removing the resist layer; and
   removing the adhesion promotion layer.

2. The method of claim 1, wherein applying the resist layer comprises:
   covering the adhesion promotion layer with the resist layer;
   patterning the resist layer and exposing a first region of the adhesion promotion layer; and
   removing at least portions of the first region of the adhesion promotion layer and
   exposing a first region of the conductive surface.

3. The method of claim 1, wherein the entire adhesion promotion layer is removed.

4. The method of claim 1, further comprising applying a conductive seed layer to the Group III nitride-based layer, the conductive seed layer providing the conductive surface.

5. The method of claim 4, wherein the removing the adhesion promotion layer comprises removing at least portions of the second region of the adhesion promotion layer and exposing a second region of the seed layer, wherein the method further comprises removing at least portions of the second region of the conductive seed layer.

6. The method of claim 5, further comprising applying a conductive diffusion barrier layer to the Group III nitride-based layer and applying the conductive seed layer to the conductive diffusion barrier layer.

7. The method of claim 6, wherein the removing at least portions of the second region of the seed layer further comprises exposing a first region of the diffusion barrier layer.

8. The method of claim 7, further comprising removing at least portions of the first region of the diffusion barrier layer.

9. The method of claim 1, wherein the adhesion promotion layer is applied by one of the group consisting of physical vapour deposition, chemical vapour deposition, electron beam evaporation, electroplating and electroless plating.

10. The method of claim 1, wherein electroplating the conductive layer onto the regions of the conductive surface comprises depositing a metal from a solution comprising a metal complex of the metal, the metal complex comprising one of the group consisting of cyanide, sulphate and thiosulfate.

11. The method of claim 1, wherein the conductive surface comprises a noble metal.

12. The method of claim 1, wherein the conductive surface and the conductive layer comprise gold and the adhesion promotion layer comprises titanium.

13. The method of claim 1, wherein the Group III nitride layer forms part of a Group III nitride-based transistor device.

14. A method, comprising:
   applying an adhesion promotion layer to a conductive seed layer arranged on a Group III nitride-based transistor device;
   applying a resist layer to the adhesion promotion layer;
   patterning the resist layer and exposing a first region of the adhesion promotion layer;
   removing at least portions of the first region of the adhesion promotion layer and exposing a first region of the conductive seed layer, the first region of the conductive seed layer being coupled to a current electrode of the Group III nitride-based transistor device;
   applying a conductive layer to the first region of the seed layer by electroplating, and
   forming a conductive contact to the current electrode.

15. The method of claim 14, further comprising:
   removing the resist layer and exposing the remainder of the adhesion promotion layer;
   removing the remainder of the adhesion promotion layer and exposing a second region of the conductive seed layer adjacent the current electrode; and
   removing the second region of the conductive seed layer.

16. The method of claim 14, wherein the seed layer and the conductive layer comprise gold and the adhesion promotion layer comprises titanium.

17. The method of claim 14, wherein the Group III nitride-based transistor device comprises a High Electron Mobility Transistor.

18. A semiconductor wafer, comprising:
   a Group III nitride-based layer;
   a noble metal layer arranged on the Group III nitride-based layer; and
   a sacrificial adhesion promotion layer arranged on at least portions of the noble metal layer.

19. The semiconductor wafer of claim 18, further comprising a resist layer arranged on at least portions of the sacrificial adhesion promotion layer.

* * * * *

UNITED STATES PATENT AND TRADEMARK OFFICE
CERTIFICATE OF CORRECTION

Page 1 of 1

PATENT NO. : 9,660,037 B1
APPLICATION NO. : 14/969786
DATED : May 23, 2017
INVENTOR(S) : A. Zechmann et al.

It is certified that error appears in the above-identified patent and that said Letters Patent is hereby corrected as shown below:

On the Title Page (72), Inventors, please change "Annette Sanger" to --Annette Saenger--.

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*